United States Patent [19]

Lenz

[11] Patent Number: 4,618,821
[45] Date of Patent: Oct. 21, 1986

[54] TEST PROBE ASSEMBLY FOR MICROELECTRONIC CIRCUITS

[76] Inventor: Seymour S. Lenz, P.O. Box 669, Longwood, Fla. 32750

[21] Appl. No.: 533,358

[22] Filed: Sep. 19, 1983

[51] Int. Cl.[4] .................. G01R 1/06; G01R 31/02
[52] U.S. Cl. ........................ 324/158 P; 324/72.5
[58] Field of Search ............ 324/158 P, 158 F, 72.5; 339/108 TP

[56] References Cited

U.S. PATENT DOCUMENTS 3,560,907 2/1971 Heller ............................ 324/158 F
3,611,128 10/1971 Nagata .......................... 324/158 P

*Primary Examiner*—Ernest F. Karlsen

[57] ABSTRACT

A test probe assembly for microelectronic circuits includes an electrically nonconductive support block, and at least one test probe of a flat metal stock, the test probe having an elongated body portion supported by the block and a probe tip with a flexed portion. The flexed portion has a flexing slot extending generally longitudinal with respect to the direction of the body portion, and defining two narrow, non-parallel flex means extending from the body portion to the probe tip. The flex beams and the flexing slot are dimensioned so that movement of the probe tip under stress toward the support block causes one of the beams to flex inwardly through the flexing slot and diminishes the distance between the two beams.

14 Claims, 4 Drawing Figures

TEST PROBE ASSEMBLY FOR MICROELECTRONIC CIRCUITS

BACKGROUND OF THE INVENTION

1. Field of the Invention

The present invention relates to testing assemblies for microelectronic circuits.

2. Description of the Prior Art

In the mass production of microelectronic circuits, it is well known that automatic equipment may be utilized to test the microelectronic circuits. Typically, the automatic equipment utilizes probe assemblies having a plurality of test probes, each test probe adapted to make electrical contact with a single position on the microelectronic circuit for testing purposes.

Since microelectronic circuits are quite small, then a very limited area on the circuit is available to make electrical contact between the tip of the test probe and the microelectronic circuit. Further, certain microelectronic circuits, particularly integrated circuits, are quite fragile and therefore to prevent damage to the circuit the contact between the test probe and the circuit test point should involve a minimum of frictional movement, particularly lateral to the test point. Further, the test probe contact should be provided with some degree of resiliency so as not to "dig" or scratch the test point surface.

Prior art microelectronic circuit test assemblies of interest include those disclosed in the following U.S. Pat. Nos.: 3,648,169 to Wiesler; 3,560,907 to Heller; 3,611,128 to Nagada; 3,930,809 to Evans; 4,034,293 to Roch; 3,955,867 to Braun, et al; 3,932,012 to Reimer, et al; 3,912,983 to Lowry; 3,891,924 to Ardezzone, et al; 3,445,770 to Harmon; 3,866,119 to Ardezzone, et al; 3,270,311 to Deer, et al; 3,414,869 to Pascua; 3,422,394 to Antes; and 3,738,560 to Kulicke, et al.

SUMMARY OF THE INVENTION

The present invention contemplates a test probe assembly for microelectronic circuits including a unitary support block of an electrically non-conductive material having first and second plane surfaces. The support block includes plural test probe slots extending from one of the surfaces and substantially short of the second surface to maintain the unitary structural integrity of the block. Plural, flexible, electrically conductive test probes are provided, each positioned in the one of the test probe slots and including a forward probe tip adapted to engage a test point of a microelectronic circuit, each probe tip extending out of the block and away from one surface and spaced on the extremity of the associated test probe slot a distance which permits the probe tip to recede into the test probe slot when under stress during testing. Means are provided for locking each test probe in the associated slot, and in the preferred embodiment comprises a key way formed in each test probe with a corresponding key way extending laterally across the support block transverse to the direction of all of the test probes, with a key locked in the key ways of the support block and all of the test probes, and fastening means joining the key to the support block. In the preferred embodiment, the key way extends into the support block from the first surface, with the key being dimensioned to extend beyond the first surface a distance that provides a stress limit to the probe tips for all of the test probes.

In the preferred embodiment, each test probe comprises a body portion abutting the block in the extremity of the associated test probe slot and extending around the key way and beyond the support block, whereby electrical connections to the test probe may be facilitated. The body portion includes a shoulder between the key way and the probe tip, the probe tapering to the probe tip from the shoulder. That portion of the test probe between the shoulder and the probe tip comprises a flexing portion having means permitting the probe tip to flex when under stress. Preferably, the flexing means comprises flexing portion having a slot therein extending generally longitudinally with respect to the direction of the associated test probe slot and the body portion of the test probe, the flexing slot defining two narrow, non-parallel flex beams extending from the area of the shoulder to the area of the probe tip. The flex means and the slot there between are dimensioned so that movement of the probe tip under stress towards the plan of the second surface of the block causes one of the beams to flex inwardly through the slot and diminish the difference between the two beams. As the probe tip rotates further toward the support block when under stress, it initially rotates about a first axis of rotation on the probe tip until one of the flex beams engages the other and thereafter rotates around an axis of rotation adjacent the shoulder. Thus, the horizontal displacement of the probe tip is substantially reduced as the stress upon the probe tip is increased, because the radius of rotation is substantially greater after one of the flex beams engages the other.

DETAILED DESCRIPTION OF THE PREFERRED EMBODIMENT

Figure 1:
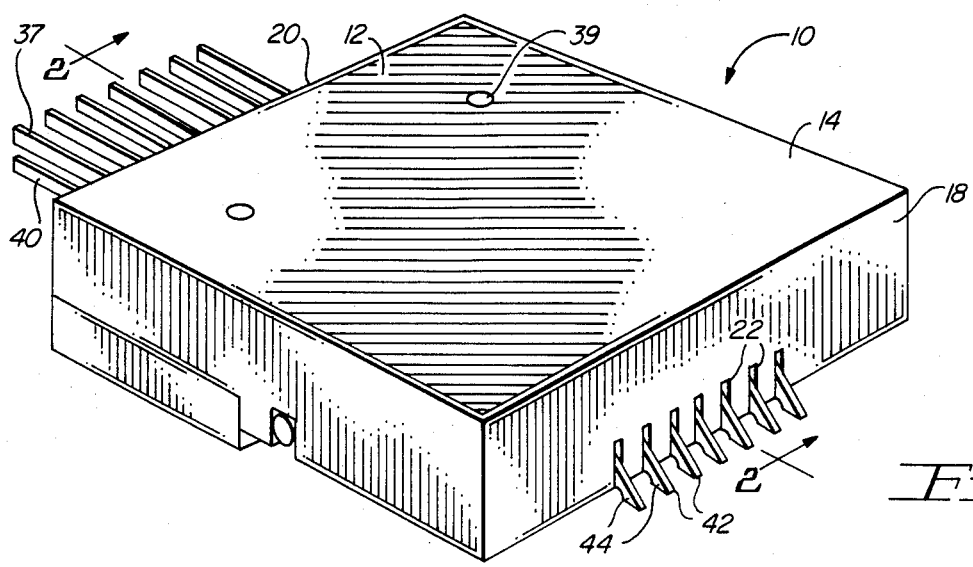
FIG. 1 is a perspective view of a test probe assembly in accordance with the present invention.

The preferred embodiment of the present invention will now be described with reference to FIGS. 1 and 2.

The test probe assembly, referred to generally by the reference numeral ten, includes a unitary support block 12 of an electrically non-conductive material having first and second plane surfaces 16 and 14, respectfully. Opposing side surfaces 18, 20 extend laterally between the first and second surfaces 16 and 14. The support block 10 includes a plurality of parallel, relatively thin test probe slots 22 extending from the first surface 16 and substantially short of the second surface 14 to maintain the unitary structural integrity of the support block 12. By way of example, the support block 12 may have a thickness of approximately 0.250 inches with the test probe slots 22 extending about 0.080 inches into the support block.

Figure 2:
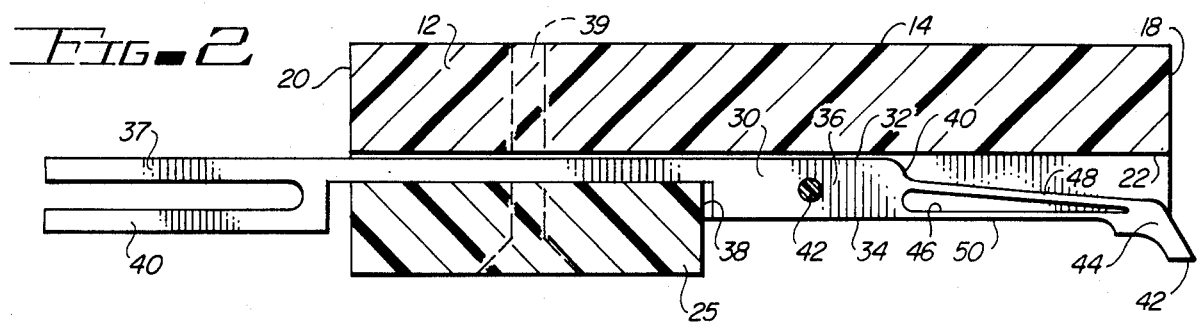
FIG. 2 is a cross sectional view of the test probe assembly of FIG. 1.

Noting both FIGS. 1 and 2, the assembly can also include a plurality of flexible, electrically conductive test probes 30, each test probe positioned in one of the test probe slots 22 and including a forward probe tip 44 adapted to engage a test point on a microelectronic circuit, each probe tip 44 extending out of the block 12 and away from the first surface 16, and spaced from the extremity of the associated test probe slot 22 a distance which permits the probe tip 44 to recede into the test probe slot 22 during testing (this dimension is shown clearly in FIG. 2). Preferably, each test probe comprises a high tensile strength metal.

In accordance with the present invention, means are provided for locking all of the test probes 30 in the associated slot 22. The locking means includes the support block having a key way 24 extending from the first surface 16 transverse to the test probe slots 22, and into the support block a lesser dimension than the test probe slots. Each test probe 30 further includes a key way 38 therein corresponding in dimension and position to the support block key way 24. A key 25 is positioned in the support block key way 24 and in the key ways 38 of all of the test probes 30. Fasteners 39, such as screws, hold the key way in place with respect to the support block 12. Preferably, the key 25 extends beyond the first surface 16 of the support block 12 a dimension which is less than the dimension between the first surface 16 and the probing tip 44 while the tip is not under stress, whereby the key 25 functions as a stress limit for the probe tip when actually subjected to stress.

As is clearly shown in FIGS. 1 and 2, the probe tip 44 of all of the test probes 30 extends beyond both the first surface 16 and the side surface 18.

With specific reference to FIG. 2, each test probe 30 includes a body portion 36 abutting the support block 12 in the extremity of the associated test probe slot 22 and extends around the key way 38 and beyond the support block 12, and then beyond the second side surface 20, whereby electrical connection to the test probe may be facilitated by a pair of tines 37, 40.

The body portion 36 of each test probe 30 includes a shoulder 40 between the key way 38 and the probe tip 44, each test probe tapering to the probe tip 44 from the shoulder 40. That portion of the test probe 30 between the shoulder 40 and the probe tip 44 comprises a flexing portion of the test probe, which includes means permitting the probe tip 44 to flex when under stress. In accordance with this invention, the flexing means includes a flexing slot 46 extending generally longitudinally with respect to the direction to the associated test probe slot, the flexing slot defining two narrow, non-parallel flex beams 48, 50 extending from the area of the shoulder 40 to the area of the probe tip 44.

The two flex beams 48, 50 and the flexing slot 46 are dimensioned so that movement of the probe tip 44 under stress against the microelectronic-contacting extremity 42 causes movement of the probe tip 44 toward the plane of the second surface 14, which in turn causes the first one of the flex beams 48 to flex inwardly through the flexing slot 46 and thereby diminish the distance between the two beams 48, 50.

Figure 3:
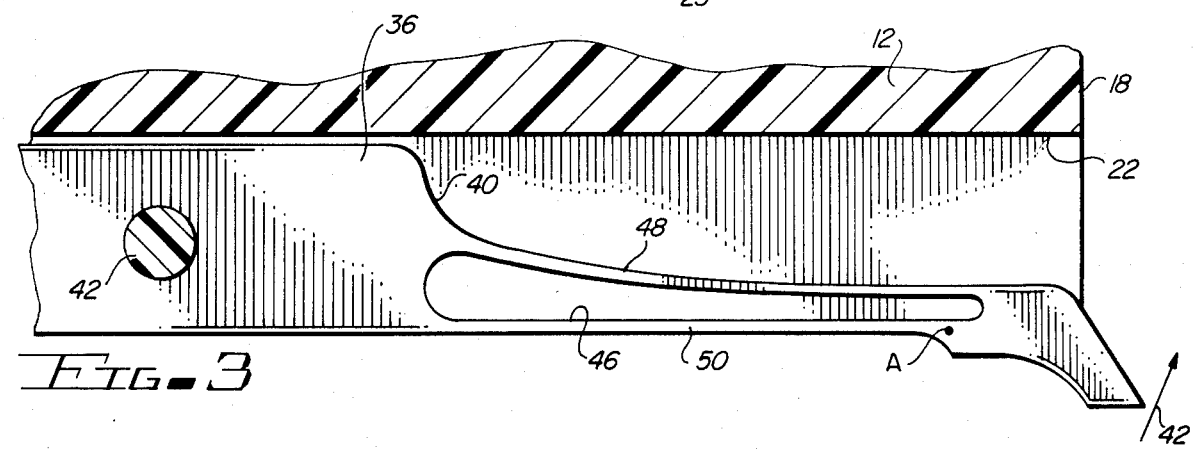
FIGS. 3 and 4 are cross sectional illustrations of a portion of the test probe assembly shown in FIG. 2, illustrating in effect the function of the test probe when under stress.

The effects of this rotational movement is shown in FIG. 3, where point "cap A" defines the axis of rotation of the probe tip 44 as the probe tip is stressed upward toward the second surface 14; note the bending of flex beam 48, and the direction of rotation as shown by the arrow adjacent the probe tip extremity 42.

Figure 4:
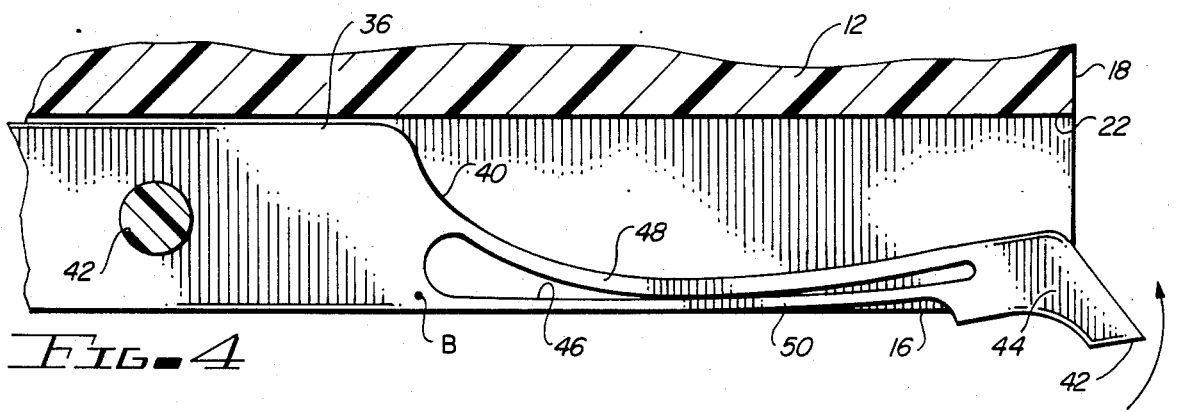

As the probe tip 44 is stressed further, the upper flex beam 48 comes in contact with the lower flex beam 50 across the flexing slot 46; note FIG. 4. Thereafter, the axis of rotation is that identified as point "B", and the direction of angular rotation is as shown by the arrow adjacent the probe tip extremity 42. Specifically, the horizontal displacement of the probe tip extremity is substantially diminished as greater stress is applied to the probe tip 44. It will also be understood that the key 25 provides a stress limit with respect to the probe tip 44.

Referring again to FIGS. 1 and 2, each test probe 30 further includes a hole 42 in the body portion 36 between the key way 38 and the shoulder 40. The support block 12 is provided with a rod slot 26 extending generally transverse to all of the test probes 30 and in alignment with all of the holes 42 and all of the test probes 30. A rod 23 of a non-conductive material extends through all of the holes in the test probe and serves to provide forward rigidity and stability for all of the test probes.

I claim:

1. A test probe assembly for microelectronic circuits, comprising:
   (a) a unitary support block of an electrically nonconductive material having first and second plane surfaces;
   (b) said support block having plural test probe slots therein extending from said first surface and substantially short of said second surface to maintain the unitary structural integrity of said support block;
   (c) plural flexible, electrically conductive test probes, each test probe positioned in one of said test probe slots and including a forward probe tip adapted to engage a test point of a microelectronic circuit, each said probe tip extending out of said block and away from said first surface and spaced from the extremity of the associated test probe slot a distance which permits the probe tip to recede into the test probe slot during testing;
   (d) said support block further including a keyway extending from said first surface transverse to said test probe slots and into said support block a lesser dimension than said test probe slots;
   (e) each said test probe further including a keyway therein corresponding in dimension and position to said support block keyway;
   (f) a key positioned in said support block keyway and said keyways of all of said test probes; and
   (g) means for fastening said key to said support block.

2. The test probe assembly recited in claim 1 wherein each said test probe comprises a high tensile strength metal.

3. The test probe assembly recited in claim 1 wherein said key extends beyond said first surface of said support block a dimension which is less than the dimension between said first surface and said probing tip while said probing tip is not under stress, whereby said key functions as a stress limit for said probe tip.

4. The test probe assembly recited in claim 1 wherein said support block further includes a side between said first and second surfaces, said probe tip extending beyond both said first surface and said side.

5. The test probe assembly recited in claim 4 wherein said test probes comprise a thin-gauge flat metal stock material, each having said keyway and probe tip integrally formed therewith.

6. The test probe assembly recited in claim 5 wherein each said test probe comprises a body portion abutting said block in the extremity of the associated test probe slot and extending around said keyway and beyond said support block at a second side opposing said side adjacent said probe tip, whereby electrical connection to said test probe may be facilitated.

7. The test probe assembly recited in claim 6 wherein said body portion includes a shoulder between said keyway and said probe tip, said test probe tapering to said probe tip from said shoulder.

8. The test probe assembly recited in claim 7 wherein the portion of each test probe between said shoulder and probe tip comprises a flexing portion of said test probe, said flexing portion having means permitting said probe tip to flex when under stress.

9. The test probe assembly recited in claim 8 wherein said flexing means comprises said flexing portion having a flexing slot therein extending generally longitudinally with respect to the direction of the associated test probe slot, said flexing slot defining two narrow, non-parallel flex beams extending from the area of said shoulder to the area of said probe tip.

10. The test probe assembly recited in claim 9 wherein said two flex beams and said flexing slot are dimensioned so that movement of said probe tip under stress toward the plane of said second surface causes one of said beams to flex inwardly through said flexing slot and diminish the distance between said two beams.

11. The test probe assembly recited in claim 7 further comprising:
(a) said body portion of each test probe having a hole between said shoulder and said keyway;
(b) said support block having a rod slot extending generally transverse to all of said test probes and in alignment with all of the holes in said test probe; and
(c) a rod extending through said rod slot and through all of said holes in said test probes.

12. A test probe assembly for microelectronic circuits comprising:
(a) an electrically non-conductive support block;
(b) at least one test probe of a flat metal stock, said test probe having an elongated body portion supported by said block, said body portion terminating in a forward shoulder;
(c) said test probe further including a probe tip and a flexed portion, said probe tip positioned forwardly of said shoulder and spaced therefrom by said flexed portion with said probe tip angling away from said flexed portion at a generally obtuse angle;
(d) said fixed portion having a flexing slot extending generally longitudinal with respect to the direction of said body portion, said flexing slot defining two narrow, non-parallel flex beams extending from the area of said shoulder to the area of said probe tip; and wherein
(e) said flexing slot and said flex beams are dimensioned such that said probe tip, when under stress, rotates about a first axis of rotation on said probe tip until one of said flex beams engages the other, and said probe tip thereafter rotating about an axis of rotation adjacent said shoulder whereby horizontal displacement of said probe tip is diminished.

13. The test probe assembly recited in claim 12 wherein said two flex beams and said flexing slot are dimensioned so that movement of said probe tip under stress toward the plane of said second surface causes one of said beams to flex inwardly through said flexing slot and diminish the distance between said two beams.

14. The test probe assembly recited in claim 12 further comprising means fastened with said support block for limiting stress on said probe tip.

* * * * *